US009626933B2

(12) United States Patent
Zheng

(10) Patent No.: US 9,626,933 B2
(45) Date of Patent: Apr. 18, 2017

(54) SHIFT REGISTER UNIT AND DRIVING METHOD, GATE DRIVE CIRCUIT AND DISPLAY DEVICE

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/895,583

(22) PCT Filed: Jun. 23, 2015

(86) PCT No.: PCT/CN2015/082015
§ 371 (c)(1),
(2) Date: Dec. 3, 2015

(87) PCT Pub. No.: WO2016/095468
PCT Pub. Date: Jun. 23, 2016

(65) Prior Publication Data
US 2016/0180800 A1 Jun. 23, 2016

(30) Foreign Application Priority Data
Dec. 18, 2014 (CN) .......................... 2014 1 0796103

(51) Int. Cl.
*G09G 5/00* (2006.01)
*G11C 19/28* (2006.01)

(52) U.S. Cl.
CPC ............ *G09G 5/003* (2013.01); *G11C 19/28* (2013.01); *G09G 2300/0871* (2013.01);
(Continued)

(58) Field of Classification Search
None
See application file for complete search history.

(56) References Cited

U.S. PATENT DOCUMENTS 8,922,471 B2 * 12/2014 Chung ................. G09G 3/3266
345/98
2011/0069044 A1 * 3/2011 Lee ........................ G11C 19/28
345/204
(Continued)

FOREIGN PATENT DOCUMENTS

CN            101202114 A     6/2008
CN            1026760407 A     10/2012
(Continued)

OTHER PUBLICATIONS

Search Report and Written Opinion Mailed Sep. 24, 2015 from State Intellectual Property Office of the P.R. China.

*Primary Examiner* — Joseph Haley
(74) *Attorney, Agent, or Firm* — Dilworth & Barrese, LLP.; Michael J. Musella

(57) ABSTRACT

A shift register unit and a driving method, a gate drive circuit and a display device, the shift register unit comprises a first transistor (T1), an input module (10), a first control module (20), a second control module (30) and an output module (40). The shift register unit and driving method, gate drive circuit and display device are capable of solving the problem that the decrease of drive capacity of the shift register unit is caused by loss of the threshold voltage.

19 Claims, 5 Drawing Sheets

(52) U.S. Cl.
CPC ............... *G09G 2310/0286* (2013.01); *G09G 2310/0289* (2013.01); *G09G 2310/08* (2013.01); *G09G 2330/021* (2013.01)

(56) References Cited

U.S. PATENT DOCUMENTS

| | | | |
|---|---|---|---|
| 2013/0169319 A1* | 7/2013 | Sasaki | ................. G09G 3/3677 327/108 |
| 2015/0301415 A1 | 10/2015 | Sawada et al. | |
| 2016/0012911 A1 | 1/2016 | Han et al. | |

FOREIGN PATENT DOCUMENTS

| | | |
|---|---|---|
| CN | 103761937 | 4/2014 |
| CN | 104464628 A | 3/2015 |
| WO | 2014069279 A | 5/2014 |

* cited by examiner

SHIFT REGISTER UNIT AND DRIVING METHOD, GATE DRIVE CIRCUIT AND DISPLAY DEVICE

TECHNICAL FIELD

The present disclosure relates in particular to a shift register unit and a driving method, a gate drive circuit and a display device.

BACKGROUND

The production of Liquid Crystal Display (LCD) or Organic Light-Emitting Diode (OLED) display requires that the drive IC (Integrated Circuit) is made on a non-display area of the display panel through the bonding technology so as to input drive signals to the display panel.

In order to reduce the cost, the Gate Driver on Array (GOA) technique is used to integrate Thin Film Transistor (TFT) gate switching circuit into array substrate of the display panel to form the scan drive to the display, thereby saving the gate drive IC.

Using the OLED display as an example, in the process of display driving, the GOA circuit sends line scan drive signal to gate line of each row in turn to open TFT in pixels of each row; then data signal is transmitted to pixel electrode connected with the drain of TFT through the source of TFT via the data line, and the data signal is converted into the current that drives OLED to have a light-emitting display.

The GOA circuit comprises a plurality of cascade shift register, and an output of the shift register at each stage is connected with TFT gate in pixel units of each row. As the trend of the display panel with higher definition and higher PPI (Pixels Per Inc) develops and the pixel number of the display panel continuously grows, line number of the gate line required to be scanned by the shift register within a scanning time of a frame is increasing. However, each shift register includes a plurality of TFTs, which would cause loss of threshold voltage in the process of signal transmission. Therefore, in the process of line scanning, the above loss of the threshold voltage causes the pulse width of the scanning signal in each row to narrow, thereby reducing the driving capacity of the shift register.

SUMMARY

Embodiments of the present disclosure provide a shift register unit and a driving method, a gate drive circuit and a display device, which resolve a problem of the driving capability of the shift register being reduced due to the loss of the threshold voltage.

In order to achieve the above mentioned object, embodiments of the present disclosure adopt the following technical solution:

An aspect of embodiments of the present disclosure provides a shift register unit, comprising: a first transistor, an input module, a first control module, a second control module and an output module;

the present disclosure provides a shift register unit, comprising: a first transistor, an input module, a first control module, a second control module and an output module;

the input module, being connected with a trigger signal end, a first clock signal end, a second clock signal end and a first node, respectively; for transmitting a signal inputted by the trigger signal end to the first node according to a signal inputted by the first clock signal end or the second clock signal end;

the first transistor, the gate thereof being connected with the first node, a first pole thereof being connected with a third clock signal end, a second pole thereof being connected with the first control module and the second node; for making the gate thereof be in a suspended state when the first transistor is turned on and the input module is turned off so that a signal inputted by the third clock signal end is transmitted to the second node without loss of threshold voltage of the first transistor; and for transmitting the signal inputted by the third clock signal end to the first control module when the first transistor is turned on;

the first control module, being connected with a first voltage end and a third node, the third clock signal end and the second pole of the first transistor, respectively; for turning on and turning off under the control of the signal inputted by the third clock signal end or the first voltage end, and for applying signal inputted by the first voltage end or the third clock signal end to the third node when the first control module is turned on;

the second control module, being connected with a second voltage end, the second node, the first clock signal end, the second clock signal end and the third node, respectively; for applying the voltage of the second voltage end to the second node according to potential of the third node and signal inputted by the first clock signal end or the second clock signal end;

the output module, being connected with the second node, the third node, the second voltage end, the second clock signal end and a signal output end of the corresponding stage, respectively; for transmitting scanning signal inputted by the second clock signal end or signal inputted by the second voltage end to the signal output end of the corresponding stage according to potential of the second node or the third node.

Another aspect of embodiments of the present disclosure provides a gate drive circuit comprising multi-stage shift register units as mentioned above.

Another aspect of embodiments of the present disclosure provides a display device comprising the gate drive circuit.

Another aspect of embodiments of the present disclosure provides a driving method of a shift register unit, comprising a method for driving any one of the shift register units as mentioned above; where a first voltage end inputs low level and a second voltage end inputs high level, the method comprises:

at a first stage, a trigger signal end and a first clock signal end input low level, and a second clock signal end and a third clock signal end input high level;

the first clock signal end inputs low level, the input module transmits the low level inputted by the trigger signal end to the first node; the first transistor is turned on, the first transistor that is turned on transmits high level inputted by the third clock signal end to the second node;

low level inputted by the first clock signal end turns a second control module on, which enables high level inputted by the second voltage end to be transmitted to the second node so that the potential of the second node maintains high level;

the low level inputted by the first clock signal end turns a first control module on, then the first control module transmits the low level inputted by the first voltage end to a third node, and the output module transmits high level inputted by a second voltage end to the signal output end of the corresponding stage under the control of the third node with low potential;

at a second stage, the third clock signal end inputs low level, and the trigger signal end, the first clock signal end and the second clock signal end input high level;

the first clock signal end and the second clock signal end input high level makes the input module turn off, and the gate of the first transistor being in a suspended state, which enables the low level inputted by the third clock signal end to be transmitted to the second node without loss of the threshold voltage; and the output module transmits the high level inputted by the second clock signal end to the signal output end of the corresponding stage under the control of the second node with low potential;

high level inputted by the first clock signal end and the second clock signal end turn the second control module off;

low level inputted by the third clock signal end turns the first control module on, then the first control module transmits the low level inputted by the third clock signal end to a third node, and the output module transmits the high level inputted by the second voltage end to the signal output end of the corresponding stage under the control of the third node with low potential;

at a third stage, the second clock signal end inputs low level, and the trigger signal end, the first clock signal end and the third clock signal end input high level;

low level inputted by the second clock signal end turns the output module on, which makes high level inputted by the trigger signal end be transmitted to the gate of the first transistor;

and the first transistor is turned off;

the first control module stays turned-on and transmits high level inputted by the third clock signal end to the third node;

high level inputted by the first clock signal end and the third clock signal end turns the second control module off, the potential of the second node maintains low level, and the output module transmits low level inputted by the second clock signal end to the signal output end of the corresponding stage;

at a fourth stage, the first clock signal end inputs low level, and the trigger signal end, the second clock signal end and the third clock signal end input high level;

low level inputted by the first clock signal end turns the second control module on, which makes high level inputted by the second voltage end be transmitted to the second node;

low level inputted by the first clock signal end turns the first control module on, which makes low level inputted by the first voltage end be transmitted to the third node; and the output module transmits high level inputted by the second voltage end to the signal output end of the corresponding stage under the control of the third node.

Embodiments of the present disclosure provide a shift register unit and a driving method, a gate drive circuit and a display device. The shift register unit comprises a first transistor, an input module, a first control module, a second control module and an output module. Then, on the one hand, the input module is turned on under the control of signal inputted by a first clock signal end and a second clock signal end, which enables the voltage inputted by a trigger signal end to be transmitted to a gate of a first transistor so as to control turning on/off the first transistor. When the input module turns the first transistor off after turning it on and then the gate of the first transistor is in a suspended state, a bootstrap function of the parasitic capacity between the gate and drain of the first transistor may transmit the signal inputted by the third clock signal end to the second node through the first transistor without loss of threshold voltage of the first transistor. Therefore, the effect of the threshold voltage on the voltage signal received by the second node is avoided. In addition, when the first transistor is turned on, signals inputted by the third clock signal end may be transmitted to a first control module; when signals inputted by the third clock signal end or the first voltage end turn the first control module on, they are transmitted to a third node. According to the potential of the third node, signals inputted by the first clock signal end or the second clock signal end turn a second control module on and off; when the second control module is turned on, the voltage of a second voltage end may be transmitted to the second node. Besides, a third control node may further control the output module to transmit the voltage of the second voltage end to a signal output end of the corresponding stage, which enables the signal output end of the corresponding stage does not output scan signals at a non-output stage of the shift register unit.

On the other hand, on the basis of the potential of the second node not suffering the loss of threshold voltage, the second node is also able to control the output module to transmit the signal inputted by the second clock signal end to the signal output end of the corresponding stage so that the signal output end of the corresponding stage scans its connected gate lines. Since the shift register unit avoids loss of threshold voltage of transistor itself in the shift register unit in the process of shifting and outputting signal, pulse width of scan signals received by the gate lines would not be narrowed and thus the drive capability of the shift register unit may be improved.

BRIEF DESCRIPTION OF THE DRAWINGS

In order to more clearly indicate the technical solutions in embodiments of the present disclosure or the prior art, accompanying drawings required in the description of embodiments of the present disclosure or the prior art are briefly introduced below. Obviously, the accompanying drawings in the following description are only some embodiments of the present disclosure, and those skilled in the art may further obtain other drawings according to these accompanying drawings without a need to pay creative work.

DETAILED DESCRIPTION OF THE EMBODIMENTS

The technical solutions in embodiments of the present disclosure are explained clearly and completely below in conjunction with accompanying drawings. Obviously, the embodiments described here are only part of embodiments of the present disclosure rather than the whole. Based on the embodiments of the present disclosure, those skilled in the art that do not pay creative work can obtain all other embodiments, which belong to the protection scope of the present disclosure.

Figure 1A:
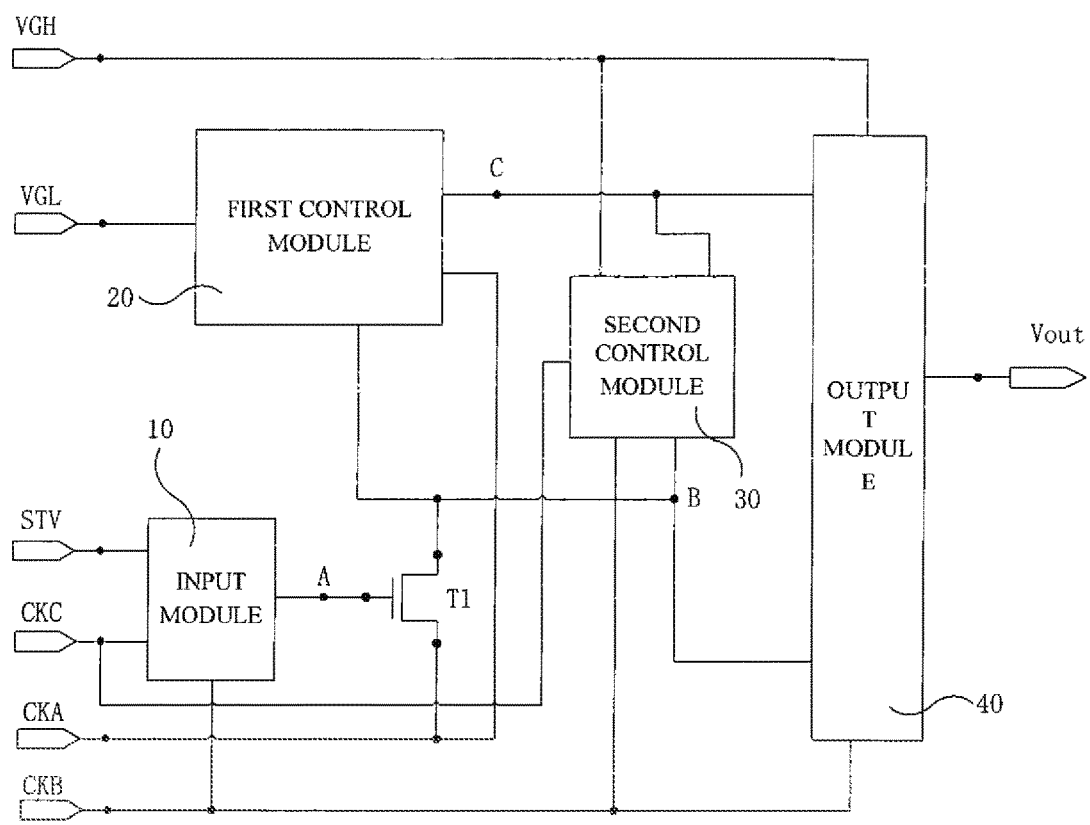
FIG. 1a is a schematic diagram of the structure of a shift register unit provided by embodiments of the present disclosure.

FIG. 1a is a schematic diagram of the structure of a shift register unit provided by embodiments of the present disclosure.

A shift register unit provided by embodiments of the present disclosure, as shown in FIG. 1a, which may comprises: a first transistor T1, an input module 10, a first control module 20, a second control module 30 and an output module 40.

For example, the input module 10 is connected with a trigger signal end STV, a first clock signal end CKC, a second clock signal end CKB and a first node A.

Signal inputted by the trigger signal end STV is transmitted to the first node A according to signal inputted by the first clock signal end CKC or the second clock signal end CKB.

The first transistor T1, a gate thereof is connected with the first node A, a first pole thereof is connected with a third clock signal end CKA, and a second pole thereof is connected with the first control module 20 and a second node B.

After the first transistor T1 is turned on and the input module is turned off, the gate of the first transistor is in a suspended state. In the meantime, a bootstrap function of the parasitic capacity between the gate and drain of the first transistor T1 transmits the signal inputted by the third clock signal end CKA to the second node B without loss of the threshold voltage (Vthp) of the first transistor T1.

In addition, when the first transistor T1 is turned on, signal inputted by the third clock signal end CKA is transmitted to the first control module 20.

The first control module 20 is connected with a first voltage end VGL, a third node C, the third clock signal end CKA and a second pole of the first transistor T1, respectively.

The first control module 20 is turned on and off under the control of signal inputted by the third clock signal end CKA or the first voltage end VGL. When the first control module 20 is turned on, the signal inputted by the first voltage end VGL or the third clock signal end CKA is applied to the third node C.

The second control module 30 may be connected with a second voltage end VGH, the second node B, the first clock signal end CKC, the second clock signal end CKB and the third node C, respectively.

The second control module 30 is used for applying voltage of the second voltage end VGH to the second node B according to the potential of the third node C and signal the inputted by the first clock signal end CKC or the second clock signal end CKB.

The output module 40 is connected with the second node B, the third node C, the second voltage end VGH, the second clock signal end CKB and a signal output end Vout of the corresponding stage, respectively.

The output module 40 is used for transmitting the signal inputted by the second clock signal end CKB or the second voltage end VGH to the signal output end Vout of the corresponding stage according to the potential of the second node B or the third node C.

It shall be noted that, firstly, the embodiments of the present disclosure make explanation by using examples of the first voltage end VGL inputting low level or being grounded and the second voltage end VGH inputting high level.

In this case, the first transistor T1 is a P-type transistor, and the transistor in the pixel unit that is connected with the gate line is also a P-type transistor. Thus the scan signal inputted by the second clock signal end CKB should be low level. Therefore, the purpose of the output module 40 transmitting high level inputted by the second voltage end VGH to the signal output end Vout of the corresponding stage according to the potential C of the third node is to avoid outputting scan signals by the signal output end Vout of the corresponding stage and thus to avoid mistakenly opening the gate line at a non-output stage of the shift register unit.

Figure 2:
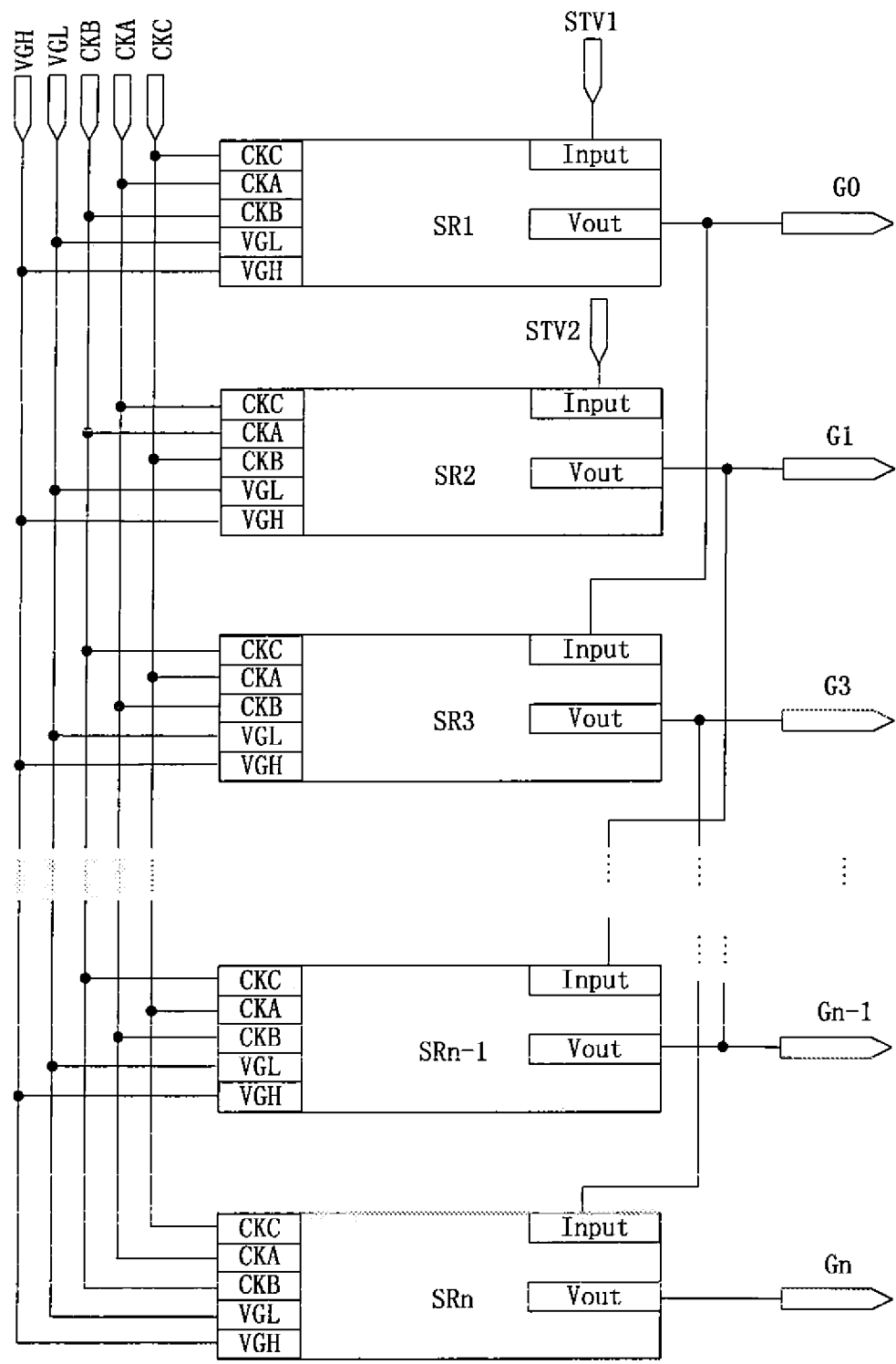
FIG. 2 is a schematic diagram of a gate drive circuit provided by embodiments of the present disclosure.

Secondly, as shown in FIG. 2, the multi-stage shift register units (SR1, SR2, . . . , SRn) as mentioned above are capable of constituting a gate drive circuit. FIG. 2 is a schematic diagram of a gate drive circuit provided by embodiments of the present disclosure.

Except for the shift register unit SRn at the last two stages, a signal output end Vout of the corresponding stage in the ith shift register unit is connected with an signal input end of the i+2th shift register unit. Wherein $1 \leq i \leq n-2$, n is the total number of the shift register units.

In addition, A signal input end Input of the first stage shift register unit SR1 in the respective stage shift register units (SR1, SR2 . . . , SRn) of the gate drive circuit is connected with a trigger signal end STV1 and a signal input end Input of the second stage shift register unit SR2 is connected with a trigger signal end STV 2. After the trigger signal end STY (comprising STV1 and STV2 which are different from each other) inputs trigger signal, the gate drive circuit starts to progressive scan the gate lines in the display panel.

Figure 1B:
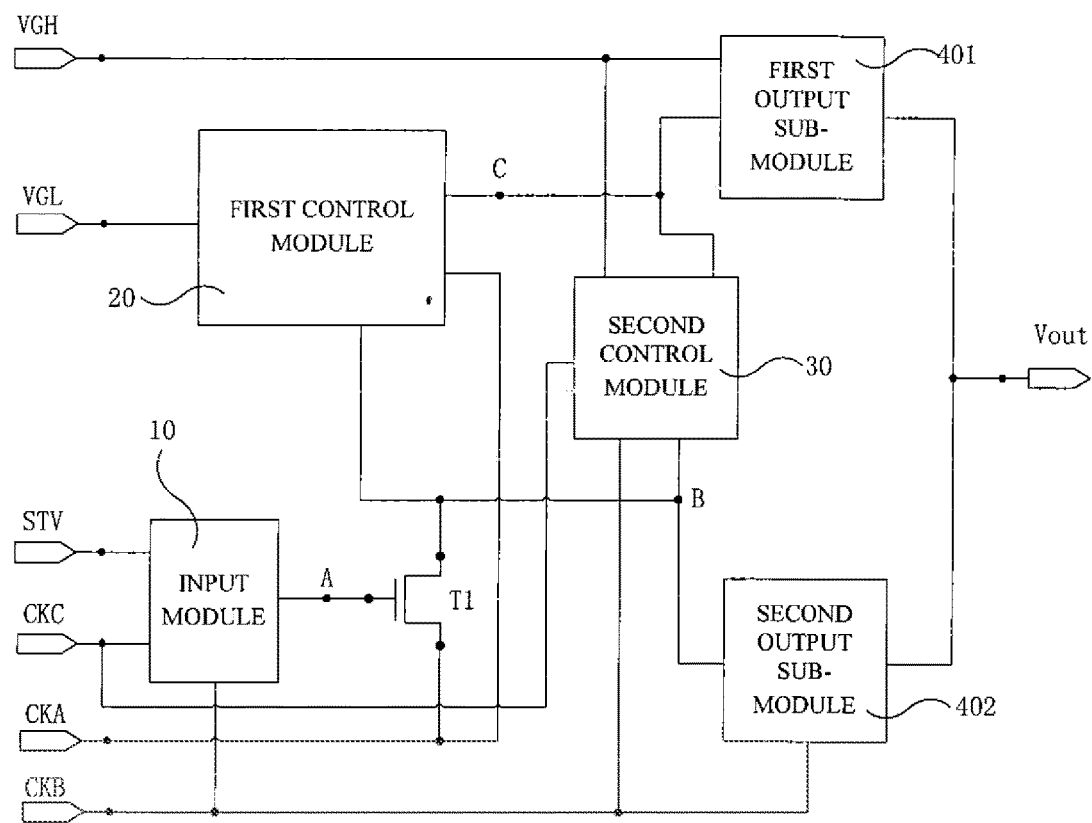
FIG. 1b is a schematic diagram of the structure of another shift register unit provided by embodiments of the present disclosure.

Thirdly, the output module 40, as shown in FIG. 1b, may comprise: a first output sub-module 401 and a second output sub-module 402. FIG. 1b is a schematic diagram of the structure of another shift register unit provided by embodiments of the present disclosure. Wherein the first output sub-module 401 is connected with the third node C, the second voltage end VGH and the signal output end Vout of the corresponding stage, respectively; the first output sub-module 401 transmits the signal inputted by the second voltage end VGH to the signal output end Vout of the corresponding stage according to the potential of the third node C. Then the third control node C may control turning on/off the first output sub-module 401; when the first output sub-module 401 is turned on, it transmits the voltage of the second voltage end VGH to the signal output end Vout of the corresponding stage so that the signal output end of the corresponding stage would not output scan signals at a non-output stage of the shift register unit.

The second output sub-module 402 is connected with the second node B, the second clock signal end CKB and the signal output end Vout of the corresponding stage, respectively; the second output sub-module 402 transmits scan signal inputted by the second clock signal end CKB to the signal output end Vout of the corresponding stage according to the potential of the second node B. Then the second node B may control the turning on/off the second output sub-module 402; after the second output sub-module 402 is turned on, when the signal inputted by the second clock signal end CKB is scan signal, the second output sub-module 402 transmits the scan signal to the signal output end Vout of the corresponding stage so that the signal output end Vout of the corresponding stage scans its connected gate line.

A shift register unit provided by embodiments of the present disclosure comprises a first transistor, an input module, a first control module, a second control module and an output module. Then, on the one hand, the input module is turned on under the control of the signal inputted by a first clock signal end and a second clock signal end, which enables the voltage inputted by a trigger signal end to be transmitted to a gate of a first transistor so as to control turning on/off the first transistor. When the input module turns the first transistor off after turning it on, at this time, the gate of the first transistor is in a suspended state, a bootstrap function of the parasitic capacity between the gate and drain of the first transistor may transmit the signal inputted by the third clock signal end to the second node through the first transistor without loss of threshold voltage of the first transistor. Therefore, the effect of the threshold voltage on the voltage signal received by the second node is avoided. In addition, when the first transistor is turned on, signals inputted by the third clock signal end may be transmitted to a first control module; when signals inputted by the third clock signal end or the first voltage end turn the first control module on, signals inputted by the third clock signal end or the first voltage end are transmitted to a third node. According to the potential of the third node, signals inputted by the first clock signal end or the second clock signal end turn a second control module on and off; when the second control module is turned on, the voltage of a second voltage end may be transmitted to the second node. Besides, a third control node may further control the output module to transmit the voltage of the second voltage end to a signal output end of the corresponding stage, which enables the signal output end of the corresponding stage does not output scan signals at a non-output stage of the shift register unit.

On the other hand, on the basis of the potential of the second node not suffering the loss of threshold voltage, the second node is also able to control the output module to transmit the signal inputted by the second clock signal end to a signal output end of the corresponding stage so that the signal output end of the corresponding stage scans its connected gate lines. Since the shift register unit avoids loss of threshold voltage of transistor itself in the shift register unit in the process of shifting and outputting signal, pulse width of scan signals received by the gate lines would not be narrowed and thus the drive capability of the shift register unit may be improved.

In the following, concrete structure of the shift register unit shown in FIG. 1a and FIG. 1b are illustrated in detail by way of examples.

Figure 3:
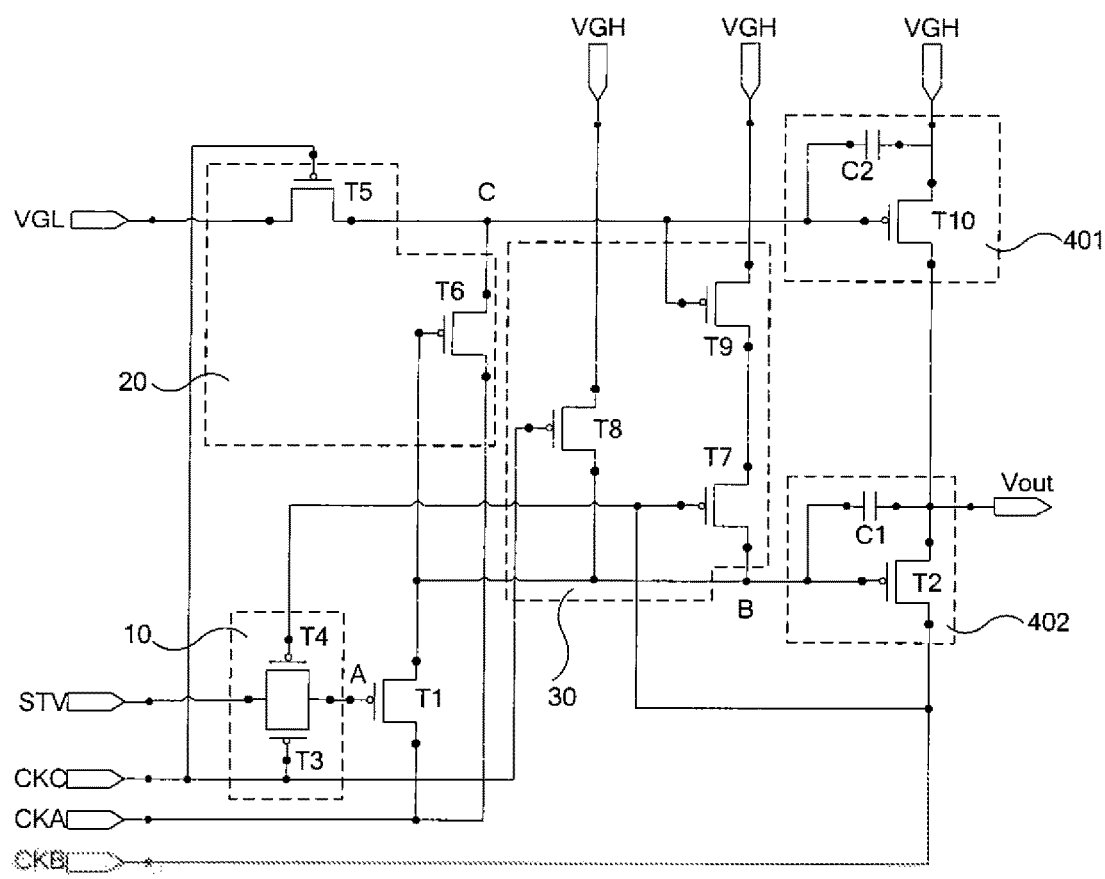
FIG. 3 is a schematic diagram of the structure of another shift register unit provided by embodiments of the present disclosure.

FIG. 3 is a schematic diagram of the structure of another shift register unit provided by embodiments of the present disclosure.

As shown in FIG. 3, a second output sub-module 402 may comprise:

a second transistor T2, a gate thereof being connected with a second node B, a first pole thereof being connected with a second clock signal end CKB, and a second pole thereof being connected with a signal output end Vout of the corresponding stage;

a first capacitor C1, one end thereof being connected with a gate of the second transistor T2, and another end thereof being connected with the second pole of the second transistor T2;

then when the second transistor T2 is turned on and the gate thereof is in a suspended state, a bootstrap function of the parasitic capacity between the gate and drain of the second transistor may transmit scan signal inputted by the second clock signal end CKB to a signal output end Vout of the corresponding stage without loss of threshold voltage (Vthp) of the second transistor T2. Therefore, the phenomenon of narrowing pulse width of scan signal may be avoided in the process of line scanning so that the drive capability of the shift register unit may be improved.

To sum up, the shift register unit uses a bootstrap function of the parasitic capacity of the first transistor T1 itself to avoid the effect of the threshold voltage on voltage signal received by the second node B. On the basis of the above, the shift register unit further uses a bootstrap function of the parasitic capacity of the second transistor T2 itself to avoid the effect of the threshold voltage loss on scan signal outputted by the signal output end Vout of the corresponding stage in the process of transmission. Therefore, the phenomenon of gradually narrowing pulse width of scan signal is avoided in the process of transmission so that the drive capability of the shift register unit may be improved.

An input module 10 may comprise:

a third transistor T3, a gate thereof being connected with the first clock signal end CKC, a first pole thereof being connected with a first node A, and a second pole thereof being connected with a trigger signal end STV;

A fourth transistor T4, a gate thereof being connected with the second clock signal end CKB, a first pole thereof being connected with the trigger signal end STY, and a second pole thereof being connected with the first node A;

when the third transistor T3 or the fourth transistor T4 is turned on, they transmit signal inputted by the trigger signal end STV to the first node A so as to control potential of the first node A.

A first control module 20 may comprise:

A fifth transistor T5, a gate thereof being connected with the first clock signal end CKC, a first pole thereof being connected with a first voltage end VGL, and a second pole thereof being connected with a third node C. when the fifth transistor T5 is turned on, the voltage of the third node C is voltage value inputted by the first voltage end VGL;

a sixth transistor T6, a gate thereof being connected with a second pole of the first transistor T1, a first pole thereof being connected with the third clock signal end CKA, and a second pole thereof being connected with the third node C. when the sixth transistor T6 is turned on, the potential of the third node C is the voltage value that the third clock signal end CKA inputs to the third node through the first transistor T1.

A second control unit 30 may comprise:

a seventh transistor T7, a gate thereof being connected with the second clock signal end CKB, a first pole thereof being connected with the second node B;

an eighth transistor T8, a gate thereof being connected with the first clock signal end CKC, a first pole thereof being connected with the second node B, and a second pole thereof being connected with a second voltage end VGH;

a ninth transistor T9, a gate thereof being connected with the third node C, a first pole thereof being connected with a second pole of the seventh transistor T7, and a second pole thereof being connected with a second voltage end VGH;

when the eighth transistor T8 is turned on, the voltage of the second node B is voltage inputted by the second voltage end VGH. When the seventh transistor T7 and the ninth transistor T9 are turned on simultaneously, the voltage of the second node B is voltage inputted by the second voltage end VGH.

The first output sub-module 401 may comprise:

a tenth transistor T10, a gate thereof being connected with the third node C, a first pole thereof being connected with a signal output end Vout of the corresponding stage, and a second pole being connected with the second voltage end VGH;

a second capacitor C2, one end thereof being connected with the gate of the tenth transistor T10, and another end thereof being connected with the second pole of the tenth transistor T10.

When the tenth transistor T10 is turned on, the signal output end Vout of the corresponding stage outputs the signal inputted by the second voltage end VGH.

Figure 4:
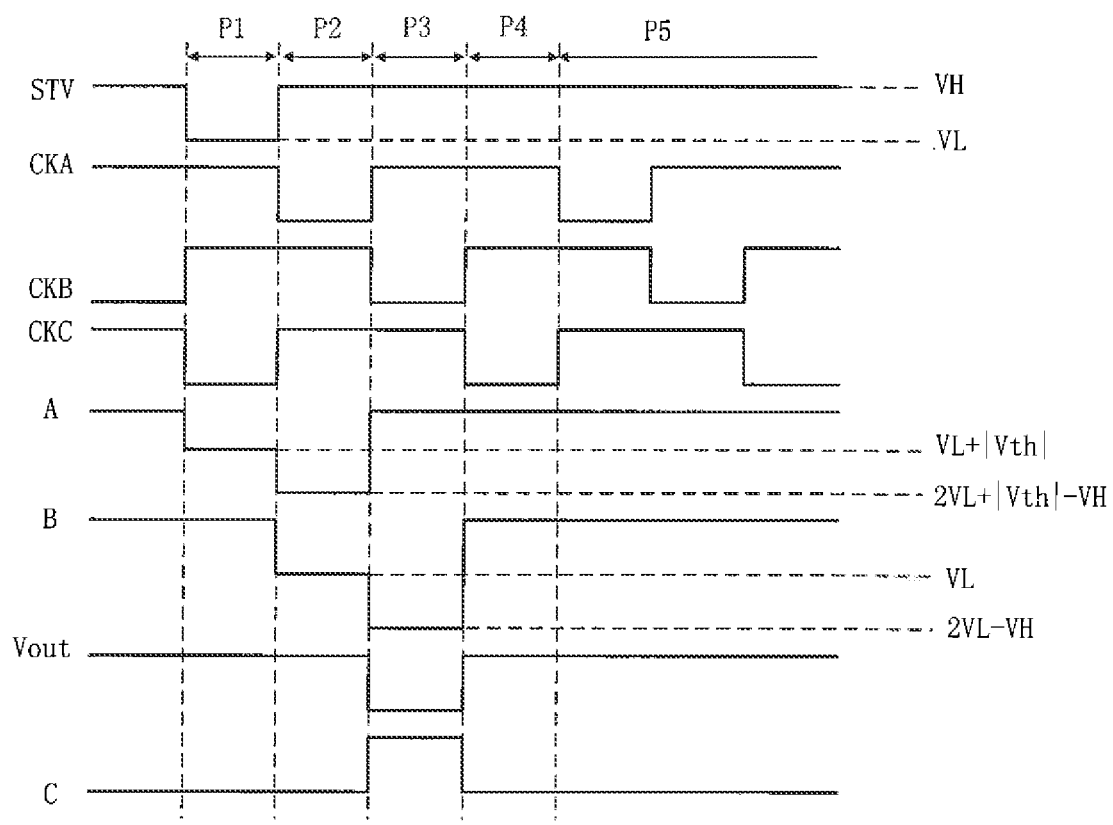
FIG. 4 is a timing chart of drive signal of a shift register unit provided by embodiments of the present disclosure.

Combining with an timing chart of a shift register unit and using the first transistor T1, the second transistor T2, the third transistor T3, the fourth transistor T4, the fifth transistor T5, the sixth transistor T6, the seventh transistor T7, the eighth transistor T8, the ninth transistor T9 and the tenth transistor T10 all being P-type transistor shown in FIG. 4 as examples, the operation process of the above shift register unit is described in detail below. The first pole of transistors may be the source and the second pole thereof may be the strain.

At the first period P1, STV=0; CKC=0; CKB=1; CKA=1; Vout=1. It shall be noted that "0" expresses low level and "1" expresses high level in the following embodiments.

The first clock signal end CKC inputs low level, and the third transistor T3 that is turned on transmits low level inputted by the trigger signal end STV to the first node A. Since the signal inputted by the trigger signal end STV would suffer loss of the threshold voltage when it goes through the third transistor T3, the potential of the first node A is VL+|Vthp|.

Under the control of the first node A with low potential, the first transistor T1 is turned on which transmits high level inputted by the third clock signal end CKA to the second node B. Under the control of the second node B with high potential, the second transistor T2 is turned off.

Low level inputted by the first clock signal end CKC turns the eighth transistor T8 on, which enables high level inputted by the second voltage end VGH to be transmitted to the second node B and the second node B maintains high level.

In the meantime, low level inputted by the first clock signal end CKC turns the fifth transistor T5 on, which makes low level inputted by the first voltage end VGL be transmitted to the third node C; under the control of the third node with low potential, the tenth transistor T10 is turned on which transmits high level inputted by the second voltage end VGH to the signal output end Vout of the corresponding stage. Since transistors in the pixel unit that is connected with the gate lines are also P-type transistor, the voltage signal output by the signal output end Vout of the corresponding stage is not scan signal. Therefore, the gate lines do not output scan signals at the first period P1.

At the second period P2, STV=1; CKC=1; CKB=1; CKA=0; Vout=1.

When the first clock signal end CKC and the second clock signal end CKB input high level, the fourth transistor T4 and the third transistor T3 are turned off. The first transistor T1 is turned on at the first period P1; however, at the present period, the gate of the first transistor T1 does not input high level which makes the first transistor T1 be turned off. Therefore, the gate of the first transistor T1 is in a suspended state. Then there exists the parasitic capacity between the gate and drain of the first transistor T1, the bootstrap function of the parasitic capacity may raise the potential of the gate with rising potential of the drain so as to ensure voltage of two ends of the parasitic capacity maintains constant.

For example, at the first period P1, the first transistor T1 is turned on; the gate, that is, the potential of the first node A is VL+|Vthp|, the drain, that is, the second node B is high level (VH); thus the voltage value of two ends of the parasitic capacity of the first transistor T1 itself is VL+|Vthp|−VH. However, at the second period P2, the gate of the first transistor T1 is in a suspended state, and the first transistor T1 is still turned on, thus the first transistor T1 may transmit low level inputted by the third clock signal end CKA to the second node B, which finally makes the potential of the second node B be low level (VL). In order to ensure that the voltage of two ends of the parasitic capacity (V+|Vthp|−VH) maintains constant, the bootstrap function of the parasitic capacity may raise the potential of the first node A to 2VL+|Vthp|−VH. At this time, the first transistor T1 works in a range of linearity.

To sum up, the bootstrap function of the parasitic capacity of the first transistor T1 itself may make low level inputted by the third clock signal end CKA be transmitted to the second node B without loss of the threshold voltage. Therefore, the phenomenon of narrowing the pulse width of the voltage signals received by the second node B caused by the loss of the threshold voltage of the transistor is avoided in the process of signal transmission.

Under the control of the second node B with low potential, the second transistor T2 is turned on; high level inputted by the second clock signal end CKB is transmitted to the signal output end Vout of the corresponding stage. Since the signal output end Vout of the corresponding stage outputs high level, the gate line would still not output scan line at the second period P2.

In addition, the first clock signal end CKC and the second clock signal end CKB input high level, which makes the seventh transistor T7 and the eighth transistor T8 be turned off. Thus the phenomenon of the second voltage end VGH raising the potential of the second node B to high level is avoided.

Low level inputted by the third clock signal end CKA turns the sixth transistor T6 on, and it is transmitted to the third node C; under the control of the third node C with low potential, the tenth transistor T10 is turned on which transmits high level inputted by the second voltage end VGH to the signal output end Vout of the corresponding stage so that the signal output end Vout of the corresponding stage outputting scan line to the gate line is avoided.

At the third period P3, STV=1; CKC=1; CKB=0; CKA=1; Vout=0.

Low level inputted by the second clock signal end CKB turns the fourth transistor T4 on, which makes high level inputted by the trigger signal end STV be transmitted to the gate of the first transistor T1, and the first transistor T1 is turned off.

Since the gate of the sixth transistor T6 does not input high level, the sixth transistor T6 holds turned-on state at the second period which transmits high level inputted by the third clock signal end CKA to the third node C. Under the control of the third node with high potential, the tenth transistor T10 is turned off. Thus the phenomenon of the tenth transistor T10 transmitting high level inputted by the second voltage end VGH to the signal output end Vout of the corresponding stage is avoided.

The first clock signal end CKC and the third clock signal end CKA input high level, which makes the eighth transistor T8 and the seventh transistor T7 be turned off. The potential of the second node B maintains low level. At the second period P2, the second transistor T2 is turned on, so the voltage between the gate and the drain is VL−VH. However, at the present period, the gate of the second transistor T2 does not input high level, which makes the second transistor T2 be turned off. Therefore, the gate of the second transistor T2 is in a suspended state. Then the parasitic capacity formed between the gate and drain of the second transistor T2 may maintain the voltage of two ends of the parasitic capacity constant through the bootstrap function. The same as the bootstrap theory of parasitic capacity of the first transistor T1 itself, as low level inputted by the second clock signal end at the present period charges the drain of the second transistor T2 (input VL), the drain of the second transistor T2, that is, the potential of the second node B is also increased and finally is stabilized at 2VL−VH. Since the absolute value of the bootstrap voltage (2VL−VH) is rather large, the conducting performance of the second transistor T2 is improved so that low level inputted by the second clock signal end CKB is transmitted to the signal output end Vout of the corresponding stage without loss of threshold voltage. At this time, the signal output end Vout of the corresponding stage outputs low level, that is, scan signal, to the gate line so as to scan the gate line.

To sum up, the shift register unit avoids the effect of the threshold voltage on the voltage signal received by the second node B through the bootstrap function of the parasitic capacity of the first transistor T1 itself. On the basis of the above, through the bootstrap function of the parasitic capacity of the second transistor T2 itself, the effect of loss of the threshold voltage on scan signal output by the signal output end Vout of the corresponding stage is avoided in the process of signal transmission. Therefore, the phenomenon of gradually narrowing the pulse width of scan signal is avoided so that the drive capability of the shift register unit may be improved. In addition, the shift register unit outputs scan signal at the third period P3, thus the third period P3 is the signal output period of the shift register unit.

At the fourth period P4, STV=1; CKC=0; CKB=1; CKA=1; Vout=1.

Low level inputted by the first clock signal end CKC turns the eighth transistor T8 on so that high level inputted by the second voltage end VGH is outputted to the second node B. Under the control of the second node B with high level, the second transistor T2 is turned off.

Low level inputted by the first clock signal end CKC turns the fifth transistor T5 on so that low level inputted by the first voltage end VGL is transmitted to the third node C. Under the control of the third node C with low level, the tenth transistor T10 is turned on which transmits the high level inputted by the second voltage end VGH to the signal output end Vout of the corresponding stage.

The fifth period P5 is a period of time from the end of the fourth period to the trigger signal end STV of next frame inputting low level again.

The first clock signal end CKC inputs low level periodically, which makes the potential of the second node C be low level, thus ensuring that the tenth transistor T10 is turned on and then outputs high level inputted by the second voltage end to the signal output end Vout of the corresponding stage.

In addition, signals inputted by the first clock signal end CKC, the second clock signal end CKB, and the third clock signal end CKA may turn the eighth transistor T8, the seventh transistor T7 and the ninth transistor T9 on and make the protection of the second node B be high level, thus the phenomenon that the turning-on of the second transistor T2 causes the signal output end Vout of the corresponding stage to mistakenly output low level is avoided. Therefore, at the fifth period P5, the signal output end Vout of the corresponding stage constantly outputs high level, so it does not input scan signal to the gate line.

It shall be noted that all the above transistors (T1-T10) may also be N-type transistor. When both the transistors in the shift register unit and transistors in the pixel unit connected with the gate line are N-type transistor, the operation timing of the drive signal and input signal of circuits are required to be adjusted accordingly.

For example, modules or transistors in FIG. 1a, FIG. 1b and FIG. 2 connected with the first voltage end VGL may be connected with the second voltage end VGH, and modules or transistors connected with the second voltage end VGH may be connected with the first voltage end VGL. In addition, in FIG. 4, the direction of the drive signal requires turning over. The detailed operation process is same as those mentioned above, thus the repetitious details need not be given here.

A display device provided by embodiments of the present disclosure comprises any of the gate drive circuits as mentioned above. The display device have the same advantageous effect as that of the gate drive circuits provided by the preceding embodiments of the present disclosure and the gate drive circuit has been explained in detailed in the preceding embodiments, thus the repetitious details need not be given here.

The display device may be: any of liquid crystal display products or components with display function such as liquid crystal display device, LCD televisions, digital photo frame, mobile phone, tablet, etc.

Embodiments of the present disclosure provides a driving method of a shift register unit, which comprises a method for driving any of the shift register unit mentioned above; in the case where the first voltage end VGL inputs low level and the second voltage end VGH inputs high level, the method may comprise:

at the first period P1, STV==0; CKC=0; CKB=1; CKA=1; Vout=1.

The first clock signal end CKC inputs low level, and the input module 10 transmits low level inputted by the trigger signal end STV to the first node A; the first transistor T1 is turned on, and high level inputted by the third clock signal end CKA is transmitted to the second node B.

Low level inputted by the first clock signal end CKC turns a second control module 30 on, which enables high level inputted by the second voltage end VGH to be transmitted to the second node B and the potential of the second node B maintains high level.

Low level inputted by the first clock signal end CKC turns a first control module 20 on, which transmits low level inputted by the first voltage end VGL to the third node C. Under the control of the third node C with low potential, an output module 40 transmits high level inputted by the second voltage end VGH to the signal output end Vout of the corresponding stage. Since transistors in the pixel unit that is connected with the gate lines are also P-type transistor and the voltage signal output by the signal output end Vout of the corresponding stage is not scan signal, the gate lines do not output scan signals at the first period P1.

At the second period P2, STV=1; CKC=1; CKB=1; CKA=0; Vout=1.

When the first clock signal end CKC and the second clock signal end CKB input high level, the input module 10 is turned off. The first transistor T1 is turned on at the first period P1; however, at the present period, the gate of the first transistor T1 does not input high level so that the first transistor T1 is turned off. Therefore, the gate of the first transistor T1 is in a suspended state. Then there exists the parasitic capacity between the gate and drain of the first transistor T1, the bootstrap function of the parasitic capacity may raise the potential of the gate with rising potential of the drain so as to ensure voltage of two ends of the parasitic capacity maintains constant. Therefore, low level inputted by the third clock signal end CKA is transmitted to the second node B without loss of the threshold voltage. Consequently, the phenomenon of narrowing the pulse width of the voltage signals received by the second node B caused by the loss of the threshold voltage of the transistor is avoided in the process of signal transmission.

Under the control of the second node B with low potential, the output module 40 transmits high level inputted by the second clock signal end CKB to the signal output end Vout of the corresponding stage. Since the signal output end Vout of the corresponding stage outputs high level, the gate line would still not output scan line at the second period P2.

In addition, high level inputted by the first clock signal end CKC and the second clock signal end CKB turn the second control module 30 off. Thus the phenomenon of the second voltage end VGH raising the potential of the second node B to high level is avoided.

Low level inputted by the third clock signal end CKA turns the first control module 20 on, which transmits low level inputted by the third clock signal end CKA to the third node C. Under the control of the third node C with low potential, the output module 40 transmits high level inputted by the second voltage end VGH to the signal output end Vout of the corresponding stage so as to avoid the signal output end Vout of the corresponding stage outputting scan line to the gate line.

At the third period, STV=1; CKC=1; CKB=0; CKA=1; Vout=0.

Low level inputted by the second clock signal end CKB turns the input module 10 on so that high level inputted by the trigger signal end STV is transmitted to the gate of the first transistor T1 and the first transistor T1 is turned off.

The first control module 20 stays turned on and transmits high level inputted by the third clock signal end CKA to the third node C.

High level inputted by the first clock signal end CKC and the third clock signal end CKA turns the second control module 30 off and the potential of the second node B maintains low level. The output module 40 transmits low level inputted by the second clock signal end CKB to the signal output end Vout of the corresponding stage. Therefore, the signal output end Vout of the corresponding stage outputs low level, that is, scan signal to the gate line, to scan the gate line.

At the fourth period, STV=1; CKC=0; CKB=1; CKA=1; Vout=1.

Low level inputted by the first clock signal end CKC turns the second control module on 30, which transmits high level inputted by the second voltage end VGH to the second node B.

Low level inputted by the first clock signal end CKC turns the first control module on 20, which transmits low level inputted by the first voltage end VGL to the third node C. Under the control of the third node C, the output module 40 transmits the high level inputted by the second voltage end VGH to the signal output end Vout of the corresponding stage.

The fifth period P5 is a period of time from the end of the fourth period P4 to the trigger signal end STV of next frame inputting low level again.

The first control module 20 is turned on periodically, which makes the potential of the second node C be low level, thus ensuring that the output module 40 is turned on and then outputs high level inputted by the second voltage end to the signal output end Vout of the corresponding stage.

In addition, signals inputted by the first clock signal end CKC, the second clock signal end CKB, and the third clock signal end CKA may turn the second control module 30 on and make the potential of the second node B be high level; the output module 40 transmits signal inputted by the second clock signal end CKB to the signal output end Vout of the corresponding stage, which causes the signal output end. Vout of the corresponding stage mistakenly outputs low level. Therefore, at the fifth period P5, the signal output end Vout of the corresponding stage constantly outputs high level, so it would not input scan signal to the gate line.

Combining with FIG. 1b and FIG. 3, the driving methods of each module and a sub module in the shift register unit are described in detail below.

The output module 40, as shown in FIG. 1b, may comprise: a first output sub-module 401 and a second output sub-module 402.

For example, in the case where the potential of the third node C is low level, the first output sub-module 401 is turned on which transmits high level inputted by the second voltage end VGH to the signal output end Vout of the corresponding stage. Then the third control node C may control turning on/off the first output sub-module 401; when the first output sub-module 401 is turned on, it transmits the voltage of the second voltage end VGH to the signal output end Vout of the corresponding stage so that the signal output end Vout of the corresponding stage would not output scan signals at a non-output stage of the shift register unit.

As shown in FIG. 3, the first output sub-module 401 may comprise a tenth transistor T10 and a second capacitor C2.

A method for driving the first output sub-module 401 may comprise: in the case where the potential of the third node C is low level, the tenth transistor T10 is turned on which transmits high level inputted by the second voltage end VGH to the signal output end Vout of the corresponding stage.

In addition, in the case where the potential of the second node B is low level, the second output sub-module 402 transmits signal inputted by the second clock signal end CKB to the signal output end Vout of the corresponding stage. Then the second node B may control turning on/off the second output sub-module 402; after the second output sub-module 402 is turned on and when the signal inputted by the second clock signal end CKB is scan signal, the second output sub-module 402 transmits the scan signal to the signal output end Vout of the corresponding stage so that the signal output end Vout of the corresponding stage scans its connected gate line.

As shown in FIG. 3, the second output sub-module 402 may comprise a second transistor T2 and a first capacitor C1.

A method for driving the second output sub-module 402 may comprise: in the case where the potential of the second node B is low level, the second transistor T2 is turned on which transmits scan signal inputted by the second clock signal end to the signal output end Vout of the corresponding stage without loss of the threshold voltage (Vthp) of the second transistor T2. Therefore, the phenomenon of narrowing pulse width of scan signal may be avoided in the process of line scanning so that the drive capability of the shift register unit may be improved.

Besides, when an input module 10 shown in FIG. 3 may comprise a third transistor T3 and a fourth transistor T4, a method for driving the input module 10 may comprise:

Low level inputted by the first clock signal end CKC or the second clock signal end CKB turns on the third transistor T3 or the fourth transistor T4 respectively, and low level inputted by the trigger signal end STV is transmitted to the first node A.

When a first control module 20 shown in FIG. 3 may comprise a fifth transistor T5 and a sixth transistor T6, a method for driving the first control module 20 may comprise:

Low level inputted by the third clock signal end CKA turns on the sixth transistor T6 through the first transistor T1, and low level inputted by the third clock signal end CKA is transmitted to the third node C; or when low level inputted by the first clock signal end CKC turns on the fifth transistor T5, low level inputted by the first voltage end VGL is transmitted to the third node C to reduce the potential of the third node C.

When a second control module 30 shown in FIG. 3 may comprise a seventh transistor T7, a eighth transistor T8 and a ninth transistor T9, a method for driving the second control module 30 may comprise:

As low level inputted by the first clock signal end CKC turns on the eighth transistor T8, high level inputted by the second voltage end VGH is outputted to the second node B; or when low level inputted by the second clock signal end CKB turns on the seventh transistor T7 and the third node C turns on the ninth transistor T9, high level inputted by the second voltage end VGH is transmitted to the second node B to raise the potential of the second node B.

Combining with the shift register unit of FIG. 3 and a timing control chart of driving signal shown in FIG. 4, a driving method of the shift register unit is described in detail below. Wherein all transistors in the shift register unit takes P-type as example. FIG. 4 is an operation timing chart of the drive signal in a shift register unit provided by the embodiments of the present disclosure.

At the first period P1, STV=0; CKC=0; CKB=1; CKA=1; Vout=1. It shall be noted that "0" expresses low level and "1" expresses high level in the following embodiments.

The first clock signal end CKC inputs low level, and the third transistor T3 is turned on which transmits low level inputted by the trigger signal end STV to the first node A. Since signal inputted by the trigger signal end STV would suffer loss of the threshold voltage when it goes through the third transistor T3, the potential of the first node A is VL+|Vthp|.

Under the control of the first node A with low potential, the first transistor T1 is turned on which transmits high level inputted by the third clock signal end CKA to the second node B. Under the control of the second node B with high potential, the second transistor T2 is turned off.

Low level inputted by the first clock signal end CKC turns on the eighth transistor T8, which enables high level inputted by the second voltage end VGH to be transmitted to the second node B and the second node 13 maintains high level.

In the meantime, low level inputted by the first clock signal end CKC turns on the fifth transistor T5, which makes low level inputted by the first voltage end VGL be transmitted to the third node C; under the control of the third node with low potential, the tenth transistor T10 is turned on which transmits high level inputted by the second voltage end VGH to the signal output end Vout of the corresponding stage. Since transistors in the pixel unit that is connected with the gate lines are also P-type transistor, the voltage signal output by the signal output end Vout of the corresponding stage is not scan signal. Therefore, the gate lines do not output scan signals at the first period P1.

At the second period P2, STV=1; CKC=1; CKB=1; CKA=0; Vout=1.

When the first clock signal end CKC and the second clock signal end CKB input high level, the fourth transistor T4 and the third transistor T3 are turned off. The first transistor T1 is turned on at the first period P1; however, at the present period, the gate of the first transistor T1 does not input high level which makes the first transistor T1 be turned off.

Therefore, the gate of the first transistor T1 is in a suspended state. Then there exists the parasitic capacity between the gate and drain of the first transistor T1, and the bootstrap function of the parasitic capacity may raise the potential of the gate with rising potential of the drain so as to ensure voltage of two ends of the parasitic capacity maintains constant.

For example, at the first period P1, the first transistor T1 is turned on; the gate, that is, the potential of the first node A is VL+|Vthp|, the drain, that is, the second node B is high level (VH); thus the voltage value of two ends of the parasitic capacity of the first transistor T1 itself is VL+|Vthp|−VH. However, at the second period P2, the gate of the first transistor T1 is in a suspended state, and the first transistor T1 is still turned on, thus the first transistor T1 may transmit low level inputted by the third clock signal end CKA to the second node B, which finally makes the potential of the second node B be low level (VL). In order to ensure that the voltage of two ends of the parasitic capacity (VL+|Vthp|−VH) maintains constant, the bootstrap function of the parasitic capacity may raise the potential of the first node A to 2VL+|Vthp|−VH. At this time, the first transistor T1 works in a range of linearity.

To sum up, the bootstrap function of the parasitic capacity of the first transistor T1 itself may make low level inputted by the third clock signal end CKA be transmitted to the second node B without loss of the threshold voltage. Therefore, the phenomenon of narrowing the pulse width of the voltage signals received by the second node B caused by the loss of the threshold voltage of the transistor is avoided in the process of signal transmission.

Under the control of the second node B with low potential, the second transistor T2 is turned on which transmits high level inputted by the second clock signal end CKB to the signal output end Vout of the corresponding stage. Since the signal output end Vout of the corresponding stage outputs high level, the gate line would still not output scan line at the second period P2.

In addition, the first clock signal end CKC and the second clock signal end CKB input high level, which makes the seventh transistor T7 and the eighth transistor T8 be turned off. Thus the phenomenon of the second voltage end VGH raising the potential of the second node B to high level is avoided.

Low level inputted by the third clock signal end CKA turns on the sixth transistor T6, and Low level inputted by the third clock signal end CKA is transmitted to the third node C; under the control of the third node C with low potential, the tenth transistor T10 is turned on, consequently high level inputted by the second voltage end VGH is transmitted to the signal output end Vout of the corresponding stage so that the signal output end Vout of the corresponding stage outputting scan line to the gate line is avoided.

At the third period P3, STV=1; CKC=1; CKB=0; CKA=1; Vout=0.

Low level inputted by the second clock signal end CKB turns on the fourth transistor T4, which makes high level inputted by the trigger signal end STV be transmitted to the gate of the first transistor T1, and the first transistor T1 is turned off.

Since the gate of the sixth transistor T6 does not input high level, the sixth transistor T6 that stays turned on at the second period transmits high level inputted by the third clock signal end CKA to the third node C. Under the control of the third node with high potential, the tenth transistor T10 is turned off. Thus the phenomenon of the tenth transistor T10 transmitting high level inputted by the second voltage end VGH to the signal output end Vout of the corresponding stage is avoided.

The first clock signal end CKC and the third clock signal end CKA input high level, which makes the eighth transistor T8 and the seventh transistor T7 be turned off. The potential of the second node B maintains low level. At the second period P2, the second transistor T2 is turned on, so the voltage between the gate and the drain is VL−VH. However, at the present period, the gate of the second transistor T2 does not input high level, which makes the second transistor T2 be turned off. Therefore, the gate of the second transistor T2 is in a suspended state. Then the parasitic capacity formed between the gate and drain of the second transistor T2 may maintain the voltage of two ends of the parasitic capacity constant through the bootstrap function. The parasitic capacity of the second transistor T2 shares the same bootstrap theory with the parasitic capacity of the first transistor T1 itself. As low level inputted by the second clock signal end at the present period charges the drain of the second transistor T2 (input VL), the drain of the second transistor T2, that is, the potential of the second node B is also increased and finally is stabilized at 2VL−VH. Since the absolute value of the bootstrap voltage (2VL−VH) is rather large, the turning-on performance of the second transistor T2 is improved so that low level inputted by the second clock signal end CKB is transmitted to the signal output end Vout of the corresponding stage without loss of threshold voltage. At this time, the signal output end Vout of the corresponding stage outputs low level, that is, scan signal, to the gate line so as to scan the gate line.

To sum up, the shift register unit avoids the effect of the threshold voltage on the voltage signal received by the second node B through the bootstrap function of the parasitic capacity of the first transistor T1 itself. On the basis of the above, through the bootstrap function of the parasitic capacity of the second transistor T2 itself, the effect of loss of the threshold voltage on scan signal output by the signal output end Vout of the corresponding stage is avoided in the process of signal transmission. Therefore, the phenomenon of gradually narrowing the pulse width of scan signal is avoided so that the drive capability of the shift register unit may be improved. In addition, the shift register unit outputs scan signal at the third period P3, thus the third period P3 is the signal output period of the shift register unit.

At the fourth period P4, STV=1; CKC=0; CKB=1; CKA=1; Vout=1.

Low level inputted by the first clock signal end CKC turns on the eighth transistor T8 so that high level inputted by the second voltage end VGH is outputted to the second node B. Under the control of the second node B with high level, the second transistor T2 is turned off.

Low level inputted by the first clock signal end CKC turns on the fifth transistor T5 so that low level inputted by the first voltage end VGL is transmitted to the third node C. Under the control of the third node C with low level, the tenth transistor T10 is turned on, the high level inputted by the second voltage end VGH is transmitted to the signal output end Vout of the corresponding stage.

The fifth period P5 is a period of time from the end of the fourth period to the trigger signal end STV of next frame inputting low level again.

The first clock signal end CKC inputs low level periodically, which makes the potential of the second node C be low level, thus ensuring that the tenth transistor T10 is turned on and then outputs high level inputted by the second voltage end to the signal output end Vout of the corresponding stage.

In addition, signals inputted by the first clock signal end CKC, the second clock signal end CKB, and the third clock signal end CKA may turn on the eighth transistor T8, the seventh transistor T7 and the ninth transistor T9 and make the protection of the second node B be high level, thus the phenomenon that the turning-on of the second transistor T2 causes the signal output end Vout of the corresponding stage to mistakenly output low level is avoided. Therefore, at the fifth period P5, the signal output end Vout of the corresponding stage constantly outputs high level, so it does not input scan signal to the gate line.

Those skilled in the art may understand that: all or part of the steps of the above method embodiments may be implemented by the corresponding hardware instructed by program; the proceeding program may be stored in a computer-readable storage medium; when the program is executed, the execution includes steps of the above method embodiments; the proceeding storage medium includes all kinds of medium such as ROM, RAM, magnetic disk or video disk, etc. which can store program codes.

The above is only the specific embodiments of the present disclosure, but the protection scope of the present disclosure is not limited thereto. Those skilled in the art that are familiar with the technical filed may easily think that any changes and modifications should be within the protection scope of the present disclosure. Therefore, the protection scope of the present disclosure shall be determined by the terms of the claims.

The present application claims the right of priority of Chinese patent application NO. 201410796103.3 submitted on Dec. 18, 2014, and the content of which are incorporated herein by reference in their entirety as a part of the application.

The invention claimed is:

1. A shift register unit, comprising: a first transistor, an input module, a first control module, a second control module and an output module;

the input module, being connected with a trigger signal end, a first clock signal end, a second clock signal end and a first node, respectively; for transmitting a signal inputted by the trigger signal end to the first node according to a signal inputted by the first clock signal end or the second clock signal end;

the first transistor, a gate thereof being connected with the first node, a first pole thereof being connected with a third clock signal end, a second pole thereof being connected with the first control module and a second node; for making the gate thereof be in a suspended state when the first transistor is turned on and the output module is turned off so that a signal inputted by the third clock signal end is transmitted to the second node without loss of threshold voltage of the first transistor; and for transmitting a signal inputted by the third clock signal end to the first control module when the first transistor is turned on;

the first control module, being connected with a first voltage end and a third node, the third clock signal end and the second pole of the first transistor, respectively; for turning on and turning off under the control of signal inputted by the third clock signal end or the first voltage end, and for applying a signal inputted by the first voltage end or the third clock signal end to the third node when the first control module is turned on;

the second control module, being connected with a second voltage end, the second node, the first clock signal end, the second clock signal end and the third node, respectively; for applying the voltage of the second voltage end to the second node according to a potential of the third node and a signal inputted by the first clock signal end or the second clock signal end;

the output module, being connected with the second node, the third node, the second voltage end, the second clock signal end and a signal output end of the corresponding stage, respectively; for transmitting a signal inputted by the second clock signal end or a signal inputted by the second voltage end to the signal output end of the corresponding stage according to potential of the second node or the third node.

2. The shift register unit according to claim 1, wherein the output module includes a first output sub-module and a second output sub-module;

the first output sub-module, being connected with the third node, the second voltage end and the signal output end of the corresponding stage, respectively; for transmitting a signal inputted by the second voltage end to the signal output end of the corresponding stage according to the potential of the third node;

the second output sub-module, being connected with the second node, the second clock signal end and the signal output end of the corresponding stage, respectively; for transmitting a scan signal inputted by the second clock signal end to the signal output end of the corresponding stage according to the potential of the second node.

3. The shift register unit according to claim 2, wherein the second output sub-module comprises:

a second transistor, a gate thereof being connected with the second node, a first pole thereof being connected with the second clock signal end, and a second pole thereof being connected with the signal output end of the corresponding stage;

a first capacitor, one end thereof being connected with a gate of the second transistor, and another end thereof being connected with the second pole of the second transistor.

4. The shift register unit according to claim 2, wherein the first output sub-module comprises:

a tenth transistor, a gate thereof being connected with the third node, a first pole thereof being connected with the signal output end of the corresponding stage, and a second pole thereof being connected with the second voltage end;

a second capacitor, one end thereof being connected with the gate of the tenth transistor, and another end thereof being connected with the second pole of the tenth transistor.

5. The shift register unit according to claim 1, wherein the input module comprises:

a third transistor, a gate thereof being connected with the first clock signal end, a first pole thereof being connected with the first node, and a second pole thereof being connected with the trigger signal end;

a fourth transistor, a gate thereof being connected with the second clock signal end, a first pole thereof being connected with the trigger signal end, and a second pole thereof being connected with the first node.

6. The shift register unit according to claim 1, wherein the first control module comprises:

a fifth transistor, a gate thereof being connected with the first clock signal end, a first pole thereof being connected with the first voltage end, and a second pole thereof being connected with the third node;

a sixth transistor, a gate thereof being connected with the second pole of the first transistor, a first pole thereof being connected with the third clock signal end, and a second pole thereof being connected with the third node.

7. The shift register unit according to claim 1, wherein the second control unit comprises:

a seventh transistor, a gate thereof being connected with the second clock signal end, and a first pole thereof being connected with the second node;

an eighth transistor, a gate thereof being connected with the first clock signal end, a first pole thereof being connected with the second node, and a second pole thereof being connected with the second voltage end;

a ninth transistor, a gate thereof being connected with the third node, a first pole thereof being connected with the second pole of the seventh transistor, and a second pole thereof being connected with the second voltage end.

8. The shift register unit according to claim 1, wherein the first transistor, the second transistor, the third transistor, the fourth transistor, the fifth transistor, the sixth transistor, the seventh transistor, the eighth transistor, the ninth transistor and the tenth transistor are all P type or N-type transistor.

9. A gate drive circuit, comprising multi-stage shift register units according to claim 1;

except for shift register units at the last two stages, the signal output end of the corresponding stage in the ith shift register unit is connected with a signal input end in the i+2th shift register unit; wherein $1 \leq i \leq n-2$, n is the total number of the shift register unit.

10. A display device, comprising the gate drive circuit of claim 9.

11. A driving method of a shift register unit, comprising a method for driving shift register unit of claim 1; where the first voltage end inputs low level and the second voltage end inputs high level, the method comprises:

at a first stage, the trigger signal end and the first clock signal end input low level, and the second clock signal end and the third clock signal end input high level;

the first clock signal end inputs low level, the input module transmits the low level inputted by the trigger signal end to the first node; the first transistor is turned on, and high level inputted by the third clock signal end is transmitted to the second node;

low level inputted by the first clock signal end turns the second control module on, which enables high level inputted by the second voltage end to be transmitted to the second node so that the potential of the second node maintains high;

the low level inputted by the first clock signal end turns the first control module on, then the first control module transmits the low level inputted by the first voltage end to the third node, and the output module transmits high level inputted by the second voltage end to the signal output end of the corresponding stage under the control of the third node with low potential;

at a second stage, the third clock signal end inputs low level, and the trigger signal end, the first clock signal end and the second clock signal end input high level;

a high level inputted by the first clock signal end and the second clock signal end turns the input module off, and the gate of the first transistor is in a suspended state, which enables low level inputted by the third clock signal end to be transmitted to the second node without loss of the threshold voltage; and the output module transmits high level inputted by the second clock signal end to the signal output end of the corresponding stage under the control of the second node with low potential;

a high level inputted by the first clock signal end and the second clock signal end turns the second control module off;

a low level inputted by the third clock signal end turns the first control module on, then the first control module transmits low level inputted by the third clock signal end to the third node, and the output module transmits high level inputted by the second voltage end to the signal output end of the corresponding stage under the control of the third node with low potential;

at a third stage, the second clock signal end inputs low level, and the trigger signal end, the first clock signal end and the third clock signal end input high level;

a low level inputted by the second clock signal end turns the output module on, which makes high level inputted by the trigger signal end be transmitted to the gate of the first transistor; and the first transistor is turned off;

the first control module holds turned on and transmits high level inputted by the third clock signal end to the third node;

a high level inputted by the first clock signal end and the third clock signal end turns the second control module off, the potential of the second node maintains low level, and the output module transmits low level inputted by the second clock signal end to the signal output end of the corresponding stage;

at a fourth stage, the first clock signal end inputs low level, and the trigger signal end, the first clock signal end and the second clock signal end input high level;

a low level inputted by the first clock signal end turns the second control module on, which makes high level inputted by the second voltage end be transmitted to the second node;

a low level inputted by the first clock signal end turns the first control module on, which makes low level inputted by the first voltage end be transmitted to the third node; and the output module transmits high level inputted by the second voltage end to the signal output end of the corresponding stage under the control of the third node.

12. The driving method of a shift register unit according to claim 11, wherein, in the case where the output module comprises the first output sub-module, the method for driving the output module comprises:

when the potential of the third node is low level, the first output sub-module is turned on, high level inputted by the second voltage end is transmitted to the signal output end of the corresponding stage.

13. The driving method of a shift register unit according to claim 11, wherein, in the case where the output module comprises the second output sub-module, the method for driving the output module comprises:

when the potential of the second node is low level, the second output sub-module transmits signal inputted by the second clock signal end to the signal output end of the corresponding stage.

14. The driving method of a shift register unit according to claim 12, wherein, in the case where the first output sub-module comprises a tenth transistor and a second capacitor, the method for driving the first output sub-module comprises:

when the potential of the third node is low, the tenth transistor is turned on, high level inputted by the second voltage end is transmitted to the signal output end of the corresponding stage.

15. The driving method of a shift register unit according to claim 13, wherein, in the case where the second output sub-module comprises a second transistor and a first capacitor, the method for driving the second output sub-module comprises:

when the potential of the second node is low, the second transistor is turned on, a signal inputted by the second clock signal end is transmitted to the signal output end of the corresponding stage without loss of the threshold voltage of the first transistor.

16. The driving method of a shift register unit according to claim 11, wherein, in the case where the input module comprises a third transistor and a fourth transistor, the method for driving the input module comprises:

a low level inputted by the first clock signal end or the second clock signal end turns on the third transistor or the fourth transistor, which transmit low level inputted by the trigger signal end to the first node.

17. The driving method of a shift register unit according to claim 11, wherein, in the case where the first control module comprises a fifth transistor and a sixth transistor, the method for driving the first control module comprises:

when low level inputted by the third clock signal end turns on the sixth transistor through the first transistor, low level inputted by the third clock signal end is transmitted to the third node; or when low level inputted by the first clock signal end turns on the fifth transistor, low level inputted by the first voltage end is transmitted to the third node.

18. The driving method of a shift register unit according to claim 11, wherein, in the case where the second control module comprises a seventh transistor, an eighth transistor and a ninth transistor, the method for driving the second control module comprises:

when low level inputted by the first clock signal end turns on the eighth transistor, high level inputted by the second voltage end is outputted to the second node; OR when low level inputted by the second clock signal end turns on the seventh transistor and the third node turns on the ninth transistor, high level inputted by the second voltage end is outputted to the second node.

19. The driving method of a shift register unit according to claim 11, wherein the method comprises:

at the first stage, the trigger signal end and the first clock signal end input low level, and the second clock signal end and the third clock signal end input high level;

the first clock signal end inputs low level, the third transistor that is turned on transmits low level inputted by the trigger signal end to the first node; the first transistor that is turned on transmits high level inputted by the third clock signal end to the second node under the control of the first node with low potential; the second transistor is turned off under the control of the second node with high potential;

a low level inputted by the first clock signal end turns on the eighth transistor, which makes high level inputted by the second voltage end be transmitted to the second node so that the potential of the second node maintains high;

a low level inputted by the first clock signal end turns on the fifth transistor, which makes low level inputted by the first voltage end to the third node; the tenth transistor that is turned on transmits high level inputted by the second clock signal end to the second voltage end to the signal output end of the corresponding stage under the control of the third node with low potential;

at the second stage, the third clock signal end inputs low level, and the trigger signal end, the first clock signal end and the second clock signal end input high level;

the first clock signal end and the second clock signal end input high level, the fourth transistor and the third transistor are turned off, which makes the gate of the first transistor be in a suspended state; low level inputted by the third clock signal end is transmitted to the second node without loss of the threshold voltage; the second transistor is turned on under the control of the second node with low potential; and high level inputted by the second clock signal end is transmitted to the signal output end of the corresponding stage;

the first clock signal end and the second clock signal end input high level, which makes the seventh transistor and the eighth transistor be turned off;

a low level inputted by the third clock signal end turns on the sixth transistor and low level inputted by the third clock signal end is transmitted to the third node; the tenth transistor that is turned on under the control of the third node with low potential transmits high level inputted by the second voltage end to the signal output end of the corresponding stage;

at the third stage, the second clock signal end inputs low level, and the trigger signal end, the first clock signal end and the third clock signal end input high level;

a low level inputted by the second clock signal end turns on the fourth transistor, which makes high level inputted by the trigger signal end be transmitted to the gate of the first transistor; and the first transistor is turned off;

the sixth transistor that holds turned on transmits high level inputted by the third clock signal end to the third node; the tenth transistor is turned off under the control of the third node with high potential;

a high level inputted by the first clock signal end and the third clock signal end turns the eighth transistor and the seventh transistor off; the potential of the second node maintains low level, which makes the gate of the second transistor be in a suspended state; and low level inputted by the second clock signal end is transmitted to the signal output end of the corresponding stage without loss of threshold voltage;

at a fourth stage, the first clock signal end inputs low level, and the trigger signal end, the first clock signal end and the second clock signal end input high level;

a low level inputted by the first clock signal end turns on the eighth transistor, which makes high level inputted by the second voltage end be transmitted to the second node; and the second transistor is turned off under the control of the second node with high potential;

a low level inputted by the first clock signal end turns on the fifth transistor, which makes low level inputted by the first voltage end be transmitted to the third node; and under the control of the third node with low potential, the tenth transistor that is turned on transmits high level inputted by the second voltage end to the signal output end of the corresponding stage.

* * * * *